United States Patent

Akamatsu et al.

[15] 3,663,222

[45] May 16, 1972

[54] PROCESS FOR PREPARING STERIC BLOCK WITH LIQUID PHOTOPOLYMERIZABLE COMPOSITION

[72] Inventors: Kiyoshi Akamatsu; Hisaaki Fukui, both of Tokyo, Japan

[73] Assignee: Asahi Kasei Kogyo Kabushiki Kaisha, Osaka, Japan

[22] Filed: June 6, 1968

[21] Appl. No.: 748,125

[52] U.S. Cl. ............ 96/35.1

[51] Int. Cl. ............ G03c 5/00

[58] Field of Search ............ 96/35.1, 36, 36.3

[56] References Cited

UNITED STATES PATENTS

| | | | |
|---|---|---|---|
| 3,210,187 | 10/1965 | Thommes | 96/83 X |
| 3,169,066 | 2/1965 | Hoerner | 96/35.1 |
| 2,929,710 | 3/1960 | Martin | 96/115 P |
| 2,480,749 | 8/1949 | Marks | 96/115 D |
| 2,760,863 | 8/1956 | Plambeck | 96/36.3 X |
| 3,157,505 | 11/1964 | Notley | 96/68 |
| 3,241,973 | 3/1966 | Thommes | 96/35.1 X |

FOREIGN PATENTS OR APPLICATIONS

| | | |
|---|---|---|
| 566,795 | 4/1943 | Great Britain |

*Primary Examiner*—Norman G. Torchin
*Assistant Examiner*—John L. Goodrow
*Attorney*—Burgess, Dinklage & Sprung

[57] ABSTRACT

A process for preparing a photopolymerized steric image-bearing block for printing, display, ceramic ware matrix, etc, which comprises disposing an image-bearing transparency or semi-transparency or one side of a photopolymerizable composition, irradiating an actinic light to both sides thereof and removing the unexposed area to give a steric image-bearing block in which a relief portion and a substrate layer are integrally formed. There can also be obtained a steric image-bearing block having a substrate layer having partly different thickness.

5 Claims, 2 Drawing Figures

INVENTORS
Kiyoshi Akamatsu
and Hisaaki Fukui

BY Burgess, Dinklage & Sprung
ATTORNEYS

PROCESS FOR PREPARING STERIC BLOCK WITH LIQUID PHOTOPOLYMERIZABLE COMPOSITION

BACKGROUND OF THE INVENTION

1. Field of the Invention

This invention relates to a process for preparing a photopolymerized steric image-bearing block by irradiating an actinic light to a photopolymerizable composition.

2. Description of the Prior Art

It is well known heretofore that a photopolymerized relief plate for printing may be obtained by irradiating an actinic light having a wave-length of 2,000 – 7,000 angstrom through an image-bearing transparency or semi-transparency disposed thereon to form an exposed area which is insoluble in solvent and corresponding to the image and then removing the unexposed area by using a suitable solvent.

When using the photopolymerized relief plate thus obtained as a printing plate, oftentimes, there are cases in which the printing plate is required to have a relief having an exact height as desired, or, having partly different heights, or, having an optional shoulder angle, depending upon needs.

However, it has been difficult to comply with the needs as the case demand according to the techniques known heretofore.

Furthermore, the support used for the relief plates of the prior arts has a drawback in that it does not adhere to a photopolymerized layer sucurely enough.

In an attempt to overcome these drawbacks mentioned above, there have been proposed a process for preparing a relief having an optional shoulder angle by using a multiple layers of plastics having different photosensitivities arranged in such a manner that the lower plastic layers will have the higher photosensitivities as disclosed in U.S. Pat. No. 3,157,505, and a process for improving adherence of a photopolymerized layer to a sheet or plate as a support by providing an anchor layer therebetween as disclosed in U.S. Pat. No. 2,791,504.

However, these processes mentioned above have disadvantages in that not only the preparation procedures involve complications but the photopolymerizable element is also complicated, since a plurality of layers having different photosensitivities must be laminated in the former process referred to above and the latter process necessitates the use of an adhesive. Moreover, it has been very difficult to form a relief having isolated dots or lines according to either of the processes mentioned above.

SUMMARY OF THE INVENTION

It is, therefore, an object of this invention to provide a photopolymerized steric image-bearing block having a substrate layer of any desired thickness without providing an anchor layer.

The present inventors have found that the object mentioned above can be accomplished by irradiating an actinic light to a photopolymerizable composition layer through an image-bearing transparency or semi-transparency disposed on one side thereof and also irradiating said actinic light to all over the opposite side of said layer and removing the unexposed area by a suitable solvent.

In accordance with this invention, there is provided a process for preparing a photopolymerized steric image-bearing block consisting of a relief portion having a height of at least 5 microns corresponding to a desired image and a substrate layer which comprises disposing an image-bearing transparency or semi-transparency on one side of a photopolymerizable composition, irradiating an actinic light to said side of the composition through said image-bearing transparency or semi-transparency to form said steric image portion as well as subjecting a whole surface of the other side of said composition to a direct irradiation of said actinic light to form said substrate layer and removing the unexposed area from the resulting photopolymerized composition.

Thus, there is required no anchor layer for joining the steric image layer and the substrate layer and the adhesion therebetween is so strong that neither peeling nor breaking off of the steric image from the substrate takes place.

Another feature of this invention is that the thickness of substrate layer or the height of steric image as well as the shoulder angle thereof may be freely varied in a wide range by adjusting the time for irradiating the actinic light to both sides of the photopolymerizable composition layer.

Still another feature of this invention is that the process may be applicable to a photopolymerizable composition even in the form of a liquid. In the prior art processes, it has been difficult to prepare a polymerized steric image-bearing block using a liquid polymerizable composition since the same is very difficulty laminated with other resins or adhered to a support.

In contrast, in accordance with this invention, a steric image-bearing block may be obtained quite easily using a liquid photopolymerizable composition by sandwiching the same between two transparent or semi-transparent plates so as not to flow out therefrom and irradiating an actinic light on both sides thereof.

As described above, in accordance with the process of this invention, there may be obtained quite easily a steric image-bearing block having a high toughness and simple structure.

The photopolymerizable composition which may be used in this invention substantially comprises unsaturated compound, photopolymerization initiator and, if necessary, thermal addition polymerization inhibitor and/or binder.

The unsaturated compounds usable in this invention include ethylenically unsaturated monomers and unsaturated polymers.

The ethylenically unsaturated monomers referred to above include, for example, acrylic or methacrylic acids and derivatives thereof, e.g. ethylene glycol diacrylate, diethylene glycol dimethacrylate, triethylene glycol diacrylate; acrylate, diacrylate, methacrylate and dimethacrylate of tetraethylene glycol, dipropylene glycol and polybutylene glycol; n-butyl methacrylate, lauryl methacrylate, α-chloroacrylic acid, acrylamide, N-methyl acrylamide, N,N'-methylene bisacrylamide, N,N'-hexamethylene-bismethacrylamide, N,N'-hexamethylene-bisacrylamide, 2-acrylylamino-N,N'-diallylglutaramide, styrene, α-chlorostyrene and p-hydroxystyrene and the like.

The unsaturated polymers referred to above include unsaturated polyesters derived from diol and unsaturated dicarboxylic acids. Usable diols include ethylene glycol, diethylene glycol, triethylene glycol, tetraethylene glycol, polyoxyethylene glycols of the formula, $HO \leftarrow CH_2-CH_2-O \rightarrow_n H$, wherein $n$ is an integer of 5 – 50, propylene glycol, dipropylene glycol, polyoxypropylene glycols of the formula, $$HO \left( CH_2\overset{\overset{CH_3}{|}}{C}H-O \right)_n H$$

wherein $n$ is an integer of 3 – 30, polyoxybutylene glycols of the formula, $HO—CH_2CH_2CH_2CH_2O—_nH$, wherein $n$ is an integer of 2 – 30 and copolyglycols having 2 – 50 of $\leftarrow CH_2CHO \rightarrow$ groups and $\leftarrow CH_2CH(CH_3)O \rightarrow$ groups mentioned above, respectively.

Examples of unsaturated dibasic acids from which the unsaturated polyesters are derived include maleic acid, fumaric acid, itaconic acid, mesaconic acid, glutaconic acid and esters or anhydrides thereof, e.g., dimethylester, ethylester or maleic anhydride.

In preparing the unsaturated polyester, 1,3-propane-diol or 1,4-butane-diol may be substituted for a part of diol exemplified above, and saturated dibasic acid such as oxalic, malonic, succinic, adipic, phthalic, isophthalic or terephthalic acids may be substituted for a part of unsaturated dibasic acids exemplified above.

The binders which may be used in this invention include cellulose esters such as acetyl cellulose, cellulose acetate hydrogen succinate, nitrocellulose, cellulose acetate propionate and cellulose butyrate, polyvinyl alcohol derivatives such as polyvinyl butyral, polyamide such as poly-ε-caprolactam, polyhexamethylene sebacamide, copoly(ε-caprolactamhexamethylene sebacamide and/or adipamide), and the inert organic or inorganic fillers such as glass, mica, potter's clay, silica, asbestos, magnesium silicate, magnesium carbonate, alumina and polyethylene-terephthalate in powder form.

The photopolymerization initiators which may be used in this invention preferably include compounds which may not be thermally activated, for example, anthraquinone, 2-methylanthraquinone, 1-chloroanthraquinone, benzoin, benzaldehyde, benzophenone and p-aminobenzophenone, and disulfides such as diphenyl disulfide, Eosine G (C. I. 45380), Fluorescein (C. I. 45350), Acriflavine (C. I. 46000) and Indanthrene (C. I. 69800).

The photopolymerizable composition referred to herein may also contain an inhibitor for thermal addition polymerization, e.g. p-methoxy phenol, hydroquinones, t-butyl catechol, pyrogallol, naphthylamines, β-naphthol, cuprous chloride and nitrobenzene, in addition to those ingredients mentioned above.

Those ingredients mentioned above may be combined optionally depending upon the desired properties of the final product to obtain a solid or liquid photopolymerizable composition.

The solid photopolymerizable composition thus obtained may be formed into a sheet or any other desired configuration by the conventional mixing and shaping methods such as rolling and extrusion or injection.

The liquid photopolymerizable composition may be obtained by mixing those ingredients mentioned above homogeneously.

Now, this invention will be explained by making reference to the accompanying drawings in which;

FIG. 1 illustrates a condition under which an actinic light is irradiated to a solid photopolymerizable composition, and FIG. 2 shows a condition under which an actinic light is irradiated to a liquid photopolymerizable composition.

Referring to FIG. 1, there is shown an assembly in which an image-bearing transparency or semi-transparency 2 and a photopolymerizable composition 3 are intimately contacted with each other by transparent or semi-transparent sheets or plates 1 and an actinic light is irradiated to both sides of the assembly from the source shown by numeral 4. Here in order to ensure the intimate contact of the image-bearing transparency or semi-transparency with the photopolymerizable composition layer, these two components may be assembled in a vacuum chamber made of a transparent material and the actinic light may be irradiated thereto from outside. It is also possible to irradiate the actinic light first to one side of the assembly alone on which a substrate is to be formed to harden a part thereof, then, subsequently irradiate the light to both sides thereof.

The liquid photopolymerizable composition may be subjected to photopolymerization by maintaining the liquid in a desired thickness while preventing the leakage by using a spacer and irradiating the actinic light thereto.

Referring to FIG. 2, there is illustrated an assembly comprising transparent or semi-transparent plates 1, an image-bearing transparency or semi-transparency 2, a transparent or semi-transparent film 3, a liquid photopolymerizable composition 4, and a spacer 6, which is irradiated by an actinic light from the source 5.

As the sources of the actinic lights, there may be employed a carbon arc lamp, mercury lamp, fluorescent lamp, xenon lamp and sunlight.

In practicing the process of this invention, the irradiation of the actinic light to both sides of the assembly need not necessarily be carried out at the same time or for an even period, i.e. the time length for the irradiation to one side thereof may be varied from that to the other side, or, the respective sides may be exposed to the irradiation separately from the other, as the needs of the case demand.

In the process of this invention, the dose of actinic light irradiated to a side in which a steric image is to be formed is such that the exposed area has a photopolymerized layer of at least 5 microns, preferably at least 10 microns in depth from the top surface irradiated and the upper limit depends upon the desired height of steric image.

On the other hand, the dose of actinic light to a side on which a substrate layer is to be formed is such that the exposed area has a photopolymerized layer of at least 1 percent of the thickness of the photopolymerizable composition layer.

As described above, in the process of this invention, the height of steric image and the thickness of substrate layer may be varied optionally by varying the doses of actinic light irradiated to both sides of the assembly.

Although different sources of actinic lights may be employed in this invention, when the same kind of source is used, the dose of actinic light may be expressed by the irradiating period. When using different types of sources, the dose of actinic light may be determined in terms of the same unit by employing a measuring equipment such as a photoelectric integrating illuminometer.

The photopolymerized steric image-bearing block prepared according to the process of this invention has remarkably excellent stability and durability as compared with those of the conventional relief plates obtained by adhering the photopolymerized composition to a support.

Presumably the reason is that in the conventional relief plates the base portion of the relief has poorer mechanical properties than the top portion thereof since the actinic light is irradiated to only one side of a photopolymerizable composition so that the interior portion of the composition tends to be insufficiently photopolymerized as compared with the surface layer.

Moreover, in the conventional relief plates an adequate shoulder angle is difficulty obtained since the dose of actinic light is decreased as the light penetrates deeper into the photopolymerizable composition and accordingly under-cut takes places. In contrast, in the process of this invention, the desired shoulder angle may be easily obtained since the polymerization of the photopolymerization composition to form a supporting substrate is proceeded uniformly by the irradiation of actinic light and no under-cut takes place.

In accordance with this invention, a printing plate having a relief which has partly different heights or having a substrate of different thickness may be obtained by first irradiating a certain dose of actinic light under such a condition that a part of the surface of one side on which a substrate layer is to be formed is masked with an opaque material, then, removing the cover and continuing the irradiation of the light.

Although, in the foregoing, the present invention is explained primarily in conjunction with the process for preparing a steric image-bearing block, it should be construed that this invention is not restricted thereto, since, apparently, there can be many different embodiments of this invention without departing from the scope and spirit of this invention.

For example, there may be prepared according to this invention various displays for advertising purpose, matrices for decorative articles, etc., other than the relief printing plate referred to above.

DESCRIPTION OF PREFERRED EMBODIMENTS

Figure 1:
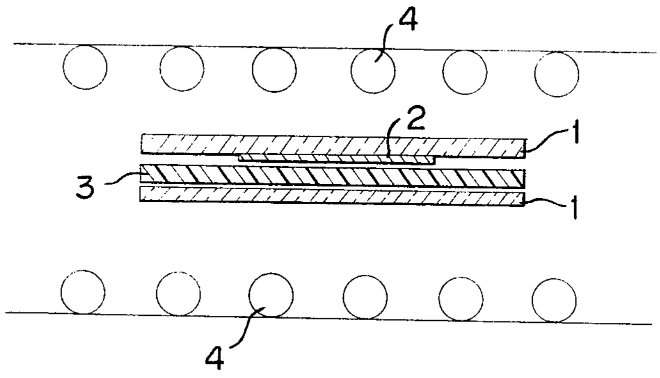
Figure 2:
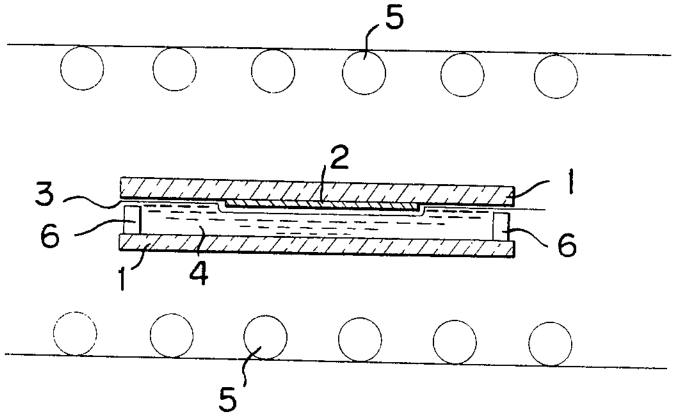

The following examples will serve to illustrate this invention more fully. However, it should not be construed that these examples restrict this invention in any way.

EXAMPLE 1

A photopolymerizable composition comprising 100 g. of an unsaturated polymer obtained from 1 mol of polyethylene glycol having a molecular weight of 600, 0.5 mol of fumaric acid and 0.5 mol of adipic acid, 20 g. of acrylic acid and 30 g. of acrylamide as unsaturated monomers, 2 g. of benzoin which is a photopolymerization initiator and 0.01 g. of p-methoxyhydroquinone as a thermal polymerization inhibitor was formed into a sheet having a thickness of 1.0 mm.

The sheet thus obtained was intimately contacted with a process photographic negative containing letters ranging 4 – 42 points and they were put into a vacuum frame consisting of two transparent glass plates.

The resulting assembly was exposed to an actinic light irradiated from a 1.5 KW high-pressure mercury lamp disposed at a distance of 50 cm. from the assembly on both sides thereof for a period of 3 minutes, respectively.

The unexposed area on the photopolymerizable composition was removed by spray washing the same with a 0.05N aqueous sodium hydroxide solution at 15° C. to produce a clear imaged relief having a supporting substrate.

The resulting relief had a height of 0.4 mm. and the supporting substrate layer thus obtained had a thickness of 0.6 mm.

The relief plate thus obtained was run by using a rotary press for at least half a million times with an excellent result.

EXAMPLE 2

There was synthetized an unsaturated polyester having an average molecular weight of 11,000 by reacting 0.25 mol of polyoxypropylene glycol having an average molecular weight of 1,200, 0.25 mol of ethylene glycol and 0.5 mol of maleic acid in a nitrogen atmosphere.

Into 70 g. of the resulting unsaturated polymer were incorporated 10 g. of acrylic acid, 10 g. of acrylamide, 10 g. of styrene, 1 g. of benzophenone as a photopolymerization initiator and 0.1 g. of hydroquinone as a thermal polymerization inhibitor to afford a liquid photopolymerizable composition.

The resulting liquid photopolymerizable composition was retained in a shallow tray-like container consisting of a spacer having a height of 1.5 mm. which forms four sides of said container and a bottom plate made of a transparent glass. On the surface of the liquid composition was disposed a halftone negative having 150 lines by inserting a transparent cellophane paper therebetween to protect the negative and a transparent glass plate was further disposed thereon to form an assembly.

The assembly thus made up was exposed from both sides thereof to 60W fluorescent lamps (FLR–BL–360, Product of Mitsubishi Electric Co., Ltd., Japan) disposed at a distance of 30 cm. from the assembly for a period of 6 minutes on the image side and for 4 minutes on the substrate side, respectively.

The unexposed area was removed by washing the same with a 0.01N aqueous sodium hydroxide solution and there was obtained a relief-like image of photopolymerized polymer.

Although depths of the halftone dots were various dependent upon the dot density, in general, the shadow portion had a depth of 10 microns and the highlight portion had that of 40 microns, from the relief face, respectively.

The printing test using the halftone plate thus obtained afforded a clear printed matter.

EXAMPLE 3

There was obtained a solid photopolymerizable composition by mixing 10 g. of polyethylene oxide having an average molecular weight of 100,000, 55 g. of acetyl cellulose, 33 g. of triethylene glycol dimethacrylate, 0.033 g. of anthraquinone and 0.01 g. of methoxy hydroquinone in a roll, and the resulting composition was formed into a sheet having a thickness of 1.5 mm. by pressing.

The sheet thus obtained was intimately contacted with a photographic negative for newspaper printing, which contained a line drawing and halftone image, in a vacuum frame and the assembly was exposed to an actinic light from both sides thereof.

When exposing, one side of the assembly having the image-bearing negative was irradiated by 3 KW carbon arc lamps disposed at a distance of 100 cm. for 5 minutes. The opposite side on which a supporting substrate layer was to be formed was irradiated by the same fluorescent lamp as used in Example 2 from the distance of 30 cm. for 6 minutes.

The unexposed area of the photopolymerizable composition was removed by washing the same with acetone to give a relief plate for newspaper printing having a relief height of 0.5 mm. for the line drawing portion and that of 15 – 30 microns for the halftone dot portion.

The relief printing plate thus obtained afforded clearer printing at a higher speed as compared with the conventional lead stero plate.

EXAMPLE 4

A liquid photopolymerizable composition was prepared and assembled in the same manner as described in Example 2 except that the thickness of the composition was 30 mm. and a process photographic negative having advertisement display lettering was used.

The both sides of the assembly thus made up were irradiated by 60W fluorescent lamps from the distance of 30 cm., respectively.

After thus exposing the negative side of the assembly for 15 minutes and the substrate side of the same for 1 minute, the unexposed area was removed by washing the same with a 0.01N aqueous caustic potassium solution and there was obtained a display plate having a relief of 2.5 mm. height and a supporting substrate layer of 0.5 mm. thickness.

EXAMPLE 5

A liquid photopolymerizable composition was prepared and assembled in the same manner as described in Example 2 except that thickness of the composition was 20 mm. and a photographic positive for a ceramic ware matrix was used.

The positive side of the assembly thus made up was irradiated by 3 KW carbon arc lamps from the distance of 100 cm. for 10 minutes, and the substrate side of the same was irradiated by 60W fluorescent lamps from the distance of 30 cm. for 3 minutes.

By following the same procedures as described in Example 2 thereafter, there was obtained a ceramic ware matrix having a relief of 1.5 mm. height, which was sufficiently endurable for practice use.

EXAMPLES 6 – 11

These examples illustrate the relationship between the dose of actinic light and the conditions of the resulting relief plate.

In each examples shown in the following Table 1, a sheet of photopolymerizable composition was prepared and assembled according to the same procedures as described in Example 1 except that the sheet had a thickness of 2.0 mm. and a process photographic negative containing letters ranging 4 – 32 points was used.

The exposure of the assembly thus made up was effected from both sides thereof by using 60W fluorescent lamps and varying the distance between the assembly and the light source, and exposure time as specified in the following Table 1. The conditions of the resulting relief are also shown in the Table 1.

TABLE 1

| Example Nos. | Exposure time (min.) | | Distance (mm.) of light source from | | Height of relief (mm.) | Thickness of substrate layer (mm.) |
|---|---|---|---|---|---|---|
| | Negative side | Substrate side | Negative side | Substrate side | | |
| 6 | 4 | 5 | 300 | 150 | 1.0 | 1.0 |
| 7 | 4 | 6.5 | 300 | 150 | 0.5 | 1.5 |
| 8 | 4 | 8 | 300 | 150 | 0.08 | 1.92 |
| 9 | 4 | 10.5 | 300 | 150 | 0.005 | 1.995 |
| 10 | 4 | 5 | 300 | 300 | 1.2 | 0.8 |
| 11 | 4 | 5 | 300 | 500 | 1.5 | 0.5 |

EXAMPLES 12 – 15

In each examples shown in the following Table 2, a liquid photopolymerizable composition was prepared and assembled in the same manner as described in Example 2 except that the thickness of the composition was 1.0 mm. and a process photographic negative containing letters ranging 4 – 32 points was used.

The assembly was irradiated by 1.5 KW high-pressure mercury lamps from the distance of 250 mm. in such a manner that either one side of the assembly was first exposed to the light, then, the remaining side was exposed with an interval as specified below therebetween. The unexposed area was treated with a 5 percent aqueous methanol solution to give a relief plate having a relief as shown in the following Table 2:

TABLE 2

| Ex. No. | Exposing manner | Height of the resulting relief (mm.) |
|---|---|---|
| 12 | Negative side was exposed for 5 minutes and after a lapse of 1 minute the substrate side was exposed for 3 minutes. | 0.8 |
| 13 | Negative side was exposed for 5 minutes and after a lapse of 4 minutes the substrate side was exposed for 8 minutes. | 0.1 |
| 14 | Substrate side was exposed for 5 minutes and after a lapse of 1 minute the negative side was exposed for 5 minutes. | 0.5 |
| 15 | Substrate side was exposed for 3 minutes and after a lapse of 5 minutes the negative side was exposed for 5 minutes. | 0.8 |

The resulting relief plates were successfully used for a rotary press to give clear printed matter.

We claim:

1. A process for preparing a photopolymerized steric image-bearing block consisting of a relief portion having a height of at least 5 microns corresponding to a desired image and a substrate layer which comprises disposing an image-bearing transparency or semi-transparency on one side of a liquid photopolymerizable composition comprising an unsaturated polyester, at least one addition-polymerizable ethylenically unsaturated monomer and a photopolymerization initiator, irradiating an actinic light to said side of the composition through said image-bearing transparency or semi-transparency to form said steric image portion as well as subjecting a whole surface of the other side of said composition to a direct irradiation of said actinic light to form said substrate layer and removing the unexposed area from the resulting photopolymerized composition.

2. A process according to claim 1 wherein said irradiation to form said substrate layer is effected with a sufficient dose of said actinic light to form said substrate layer having a thickness of at least 1 percent of the total thickness of the photopolymerizable composition layer.

3. A process according to claim 1 wherein said irradiation of actinic light is effected to both sides of said composition simultaneously.

4. A process according to claim 1 wherein said irradiation of actinic light is effected in such a manner that either one side of said composition is first irradiated and the remaining side is subsequently irradiated.

5. A process according to claim 1 wherein said irradiation of actinic light is effected in such a manner that a predetermined dose of actinic light is first given to a part of said composition by way of partly masking the irradiation and continuing the irradiation after removing the mask to obtain said substrate layer having partly different thickness.

* * * * *